US011469129B2

(12) United States Patent
Takahashi

(10) Patent No.: US 11,469,129 B2
(45) Date of Patent: Oct. 11, 2022

(54) WAFER SUPPORT TABLE

(71) Applicant: NGK INSULATORS, LTD., Nagoya (JP)

(72) Inventor: Tomohiro Takahashi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 110 days.

(21) Appl. No.: 16/720,688

(22) Filed: Dec. 19, 2019

(65) Prior Publication Data

US 2020/0135526 A1 Apr. 30, 2020

Related U.S. Application Data

(63) Continuation of application No. PCT/JP2019/015385, filed on Apr. 9, 2019.

(30) Foreign Application Priority Data

Apr. 27, 2018 (JP) ............................ JP2018-086780

(51) Int. Cl.
*F27D 11/00* (2006.01)
*H01L 21/683* (2006.01)
(Continued)

(52) U.S. Cl.
CPC ...... *H01L 21/683* (2013.01); *H01L 21/67103* (2013.01); *H01L 21/67248* (2013.01); *H05B 3/143* (2013.01); *H05H 1/46* (2013.01)

(58) Field of Classification Search
CPC .......... H01J 37/32532; H01J 37/32724; H01L 21/67103; H01L 21/67248; H01L 21/683;
(Continued)

(56) References Cited

U.S. PATENT DOCUMENTS 7,053,339 B2 * 5/2006 Goto ...................... H05B 3/283 219/444.1
2003/0089600 A1 * 5/2003 Natsuhara ........... H01L 21/6831 204/297.01

(Continued)

FOREIGN PATENT DOCUMENTS

CN 1452232 A 10/2003
JP H11-162698 A1 6/1999

(Continued)

OTHER PUBLICATIONS

English translation of the International Preliminary Report on Patentability (Chapter I) (Application No. PCT/JP2019/015385) dated Nov. 5, 2020.

(Continued)

*Primary Examiner* — Sang Y Paik
(74) *Attorney, Agent, or Firm* — Burr & Brown, PLLC

(57) ABSTRACT

A wafer support table includes a ceramic base and a rod. The ceramic base has a wafer placement surface and includes an RF electrode and a heater electrode that are embedded therein in the mentioned order from the side closer to the wafer placement surface. A hole is formed in the ceramic base to extend from a rear surface toward the RF electrode. The rod is made of Ni or Kovar, is bonded to a tablet exposed at a bottom surface of the hole, and supplies radio-frequency electric power to the RF electrode therethrough. An Au thin film is coated over a region of an outer peripheral surface of the rod ranging from a base end of the rod to a predetermined position.

5 Claims, 7 Drawing Sheets

(51) Int. Cl.
*H01L 21/67* (2006.01)
*H05B 3/14* (2006.01)
*H05H 1/46* (2006.01)

(58) Field of Classification Search
CPC .......... H01L 21/6831; H01L 21/68757; H05B 3/143; H05B 3/283; H05H 1/46
USPC ............................................ 219/443.1–444.1
See application file for complete search history.

(56) References Cited

U.S. PATENT DOCUMENTS

2008/0116187 A1 5/2008 Sugimoto et al.
2017/0278682 A1* 9/2017 Lin .................. H01J 37/32577
2018/0337081 A1* 11/2018 Ye ....................... H01L 21/6833

FOREIGN PATENT DOCUMENTS

JP 2008-130609 A1 6/2008
JP 2008-182129 A1 8/2008

OTHER PUBLICATIONS

International Search Report and Written Opinion (Application No. PCT/JP2019/015385) dated Jul. 9, 2019.
Taiwanese Office Action, Taiwanese Application No. 108112636, dated Aug. 18, 2022 (4 pages).

* cited by examiner

WAFER SUPPORT TABLE

BACKGROUND OF THE INVENTION

1. Field of the Invention

The present invention relates to a wafer support table.

2. Description of the Related Art

In a known example of a wafer support table for use in performing a film formation process by plasma CVD, a plasma etching process, etc. on a wafer, a radio-frequency electrode (RF electrode) is embedded in a ceramic base, and plasma is generated using the RF electrode. In a wafer support table disclosed in Patent Literature (PTL) 1, for example, a hole through which a Ni-made rod for supplying electric power to the RF electrode is inserted is formed in a rear surface of a ceramic plate to extend toward the RF electrode. A metal-made conductive member connected to the RF electrode is exposed at a bottom surface of the hole and is bonded to the rod, which is inserted into the hole, by brazing in an electrically conductible manner. A radio-frequency power supply is connected to the rod for supply of electric power to the RF electrode. Furthermore, a heater electrode for heating the wafer is embedded in the ceramic base.

CITATION LIST

Patent Literature

PTL 1: JP 2008-130609 A

SUMMARY OF THE INVENTION

In the above-described wafer support table, however, when the wafer is heated to a preset temperature (e.g., 450° C. to 550° C.) by supplying electric power to the heater electrode, the temperature in a portion of the wafer, the portion being positioned just above the rod connected to the RF electrode, rises to a specifically high temperature in some cases. If such a specifically high-temperature portion is present in the wafer, a problem may arise in causing unevenness in plasma treatment carried on the wafer.

The present invention has been made with intent to solve the above-described problem, and a main object of the present invention is to prevent a temperature rise in a portion of a wafer, the portion being positioned just above a rod connected to an RF electrode, to a specifically high temperature at a low cost.

The present invention provides a wafer support table including:

a ceramic base having a wafer placement surface and including an RF electrode and a heater electrode that are embedded in the ceramic base in mentioned order from side closer to the wafer placement surface;

a hole formed in the ceramic base to extend, toward the RF electrode, from a surface of the ceramic base on side opposite to the wafer placement surface;

a Ni- or Kovar-made rod bonded to the RF electrode exposed at a bottom surface of the hole or to a conductive member that is connected to the RF electrode and is exposed at the bottom surface of the hole, and supplying radio-frequency electric power to the RF electrode therethrough; and a thin film of a copper family element coated over a region of an outer peripheral surface of the rod ranging from a base end of the rod to a predetermined position at which the rod is not inserted in the hole.

In the wafer support table described above, the Ni- or Kovar-made rod is used to supply the radio-frequency electric power to the RF electrode. When the radio-frequency electric power is supplied to that type of rod, the temperature of the rod is apt to become high in a range lower than the Curie point (Ni; about 354° C., Kovar; about 435° C.) because impedance is large, but it is less apt to become high in a range not lower than the Curie point because impedance is small. The above-described phenomenon of a temperature rise in a portion of a wafer, the portion being positioned just above the rod, to a specifically high temperature is presumably attributable to the fact that, because the rod is entirely heated to high temperature and heat dissipating from the ceramic base through the rod is smaller than that estimated. In the wafer support table according to the present invention, the thin film of the copper family element is coated over a region of the outer peripheral surface of the rod, the region ranging from the base end of the rod to the predetermined position at which the rod is not inserted in the hole, i.e., over a region relatively far away from the ceramic base. In this case, because the copper family element (Cu, Ag or Au) has low impedance and a radio-frequency wave passes through the thin film of the copper family element due to the skin effect, the temperature in a portion coated with the thin film of the copper family element (i.e., in a portion relatively far away from the ceramic base) is less apt to become high, and that portion does not impede dissipation of heat from the ceramic base. On the other hand, because a portion of the rod, the portion being inserted into the hole, is positioned near the heater electrode and is heated to high temperature, the above portion does not substantially contribute to dissipating the heat from the ceramic base. Therefore, coating the above portion with the thin film of the copper family element is disadvantageous in an economical point of view. Thus, the wafer support table according to the present invention can prevent the temperature rise in a portion of the wafer, the portion being positioned just above the rod connected to the RF electrode, to the specifically high temperature at a low cost.

In the wafer support table according to the present invention, the thin film of the copper family element preferably has a thickness of not less than 3 μm and not more than 6 μm. If the thickness of the thin film of the copper family element is not less than 3 μm, the impedance resulting when the radio-frequency electric power is supplied to the rod can be held sufficiently small. On the other hand, even if the thickness of the thin film of the copper family element is set to a value over 6 μm, the impedance resulting when the radio-frequency electric power is supplied to the rod is substantially not changed. Taking into consideration economy, therefore, the thickness of the thin film of the copper family element is preferably not more than 6 μm.

In the wafer support table according to the present invention, assuming that the rod not coated with the thin film of the copper family element is used instead of the rod coated with the thin film of the copper family element, a temperature of the heater electrode is denoted by Ts [° C.] (Ts is higher than the Curie point of a material of the rod), a length of the rod is denoted by L [cm], a difference in temperature between both ends of the rod is denoted by ΔT [° C.], a length from a tip end of the rod to the predetermined position is denoted by x [cm], and a temperature at the predetermined position of the rod is denoted by T(x) [° C.], the predetermined position may be determined such that T(x) expressed by $T(x)=Ts-(\Delta T/L)*x$ is not higher than the Curie point of the material of the rod. In the region between the predetermined position set as described above and the base end of the rod, the temperature is apt to become high because the impedance of the rod is large. Thus, the significance of coating the thin film of the copper family element over the above-mentioned region is high, but the significance of coating the thin film of the copper family element over the other region is low.

DETAILED DESCRIPTION OF THE INVENTION

Figure 1:
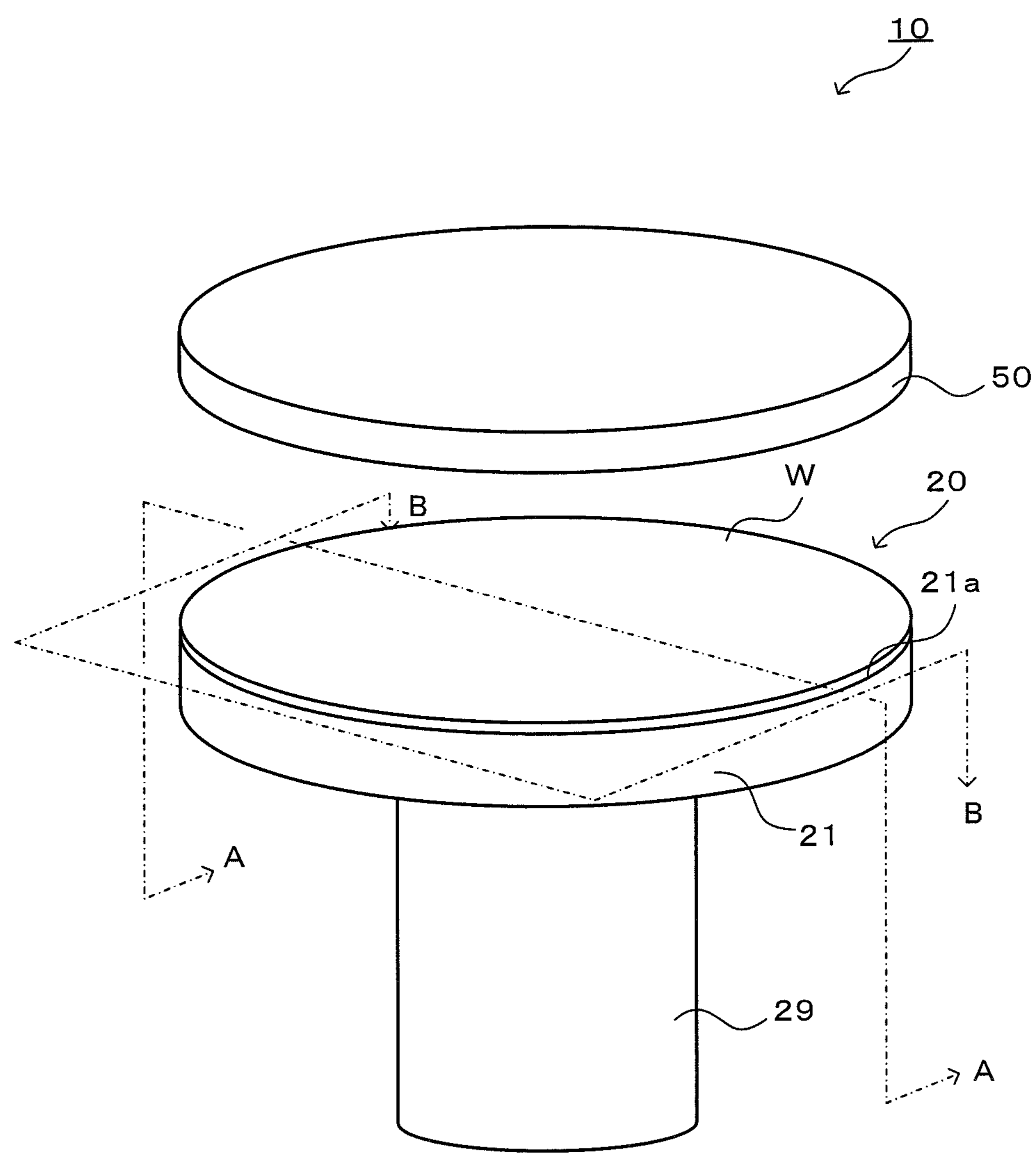
FIG. 1 is a perspective view schematically illustrating a structure of a plasma generator 10.
Figure 2:
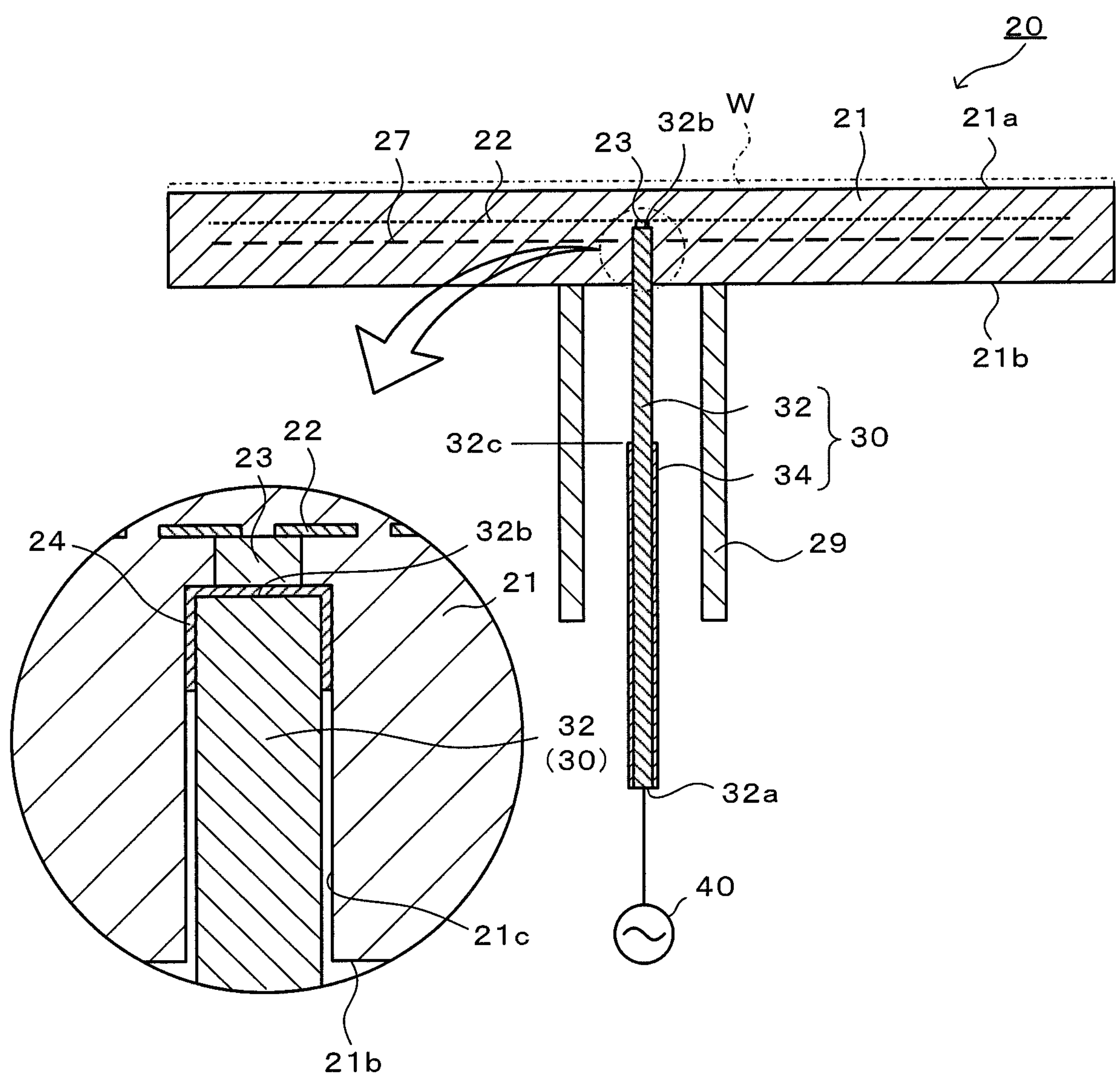
FIG. 2 is a sectional view taken along A-A in FIG. 1.
Figure 3:
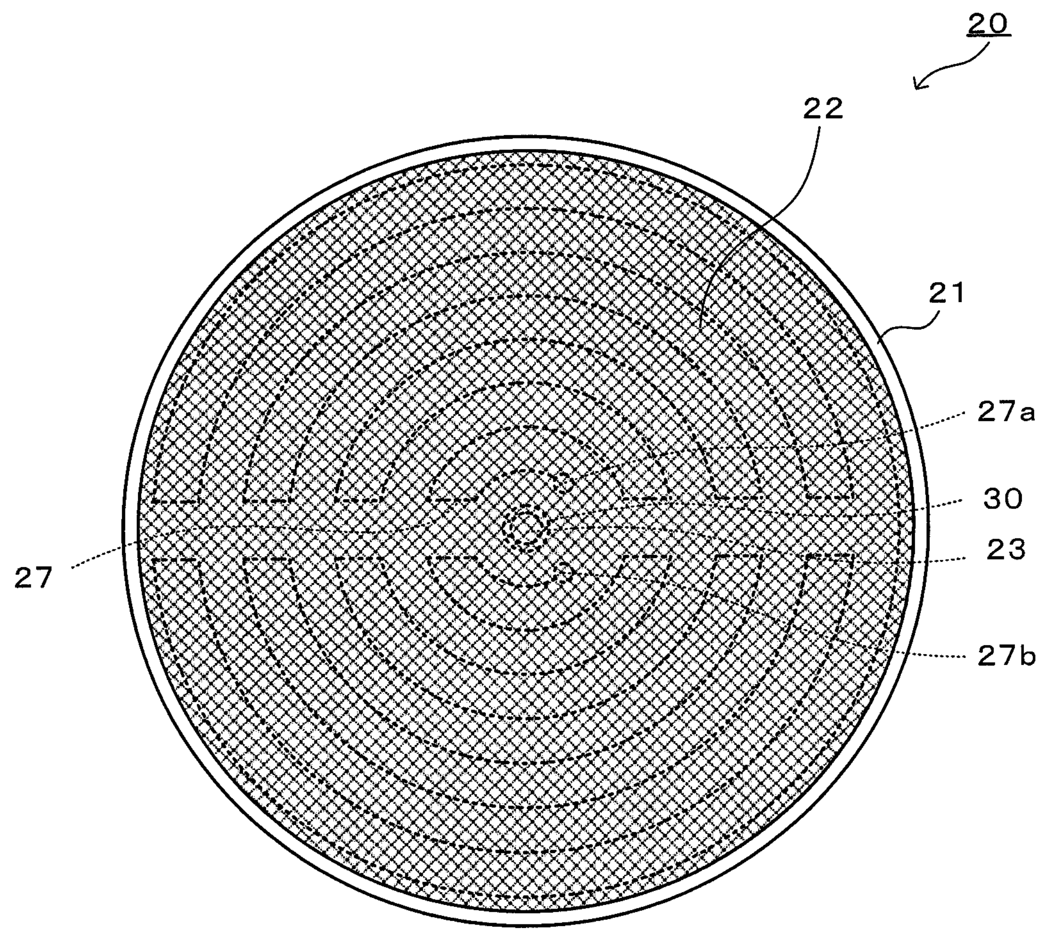
FIG. 3 is a sectional view taken along B-B in FIG. 1.

A preferred embodiment of the present invention will be described below with reference to the drawings. FIG. 1 is a perspective view of a plasma generator 10, FIG. 2 is a sectional view taken along A-A in FIG. 1, and FIG. 3 is a sectional view taken along B-B in FIG. 1.

As illustrated in FIG. 1, the plasma generator 10 includes a wafer support table 20 and an upper electrode 50.

The wafer support table 20 is used to support and heat a wafer W on which CVD or etching is to be performed with the aid of plasma, and it is mounted inside a not-illustrated chamber for a semiconductor process. The wafer support table 20 includes a ceramic base 21 and a hollow ceramic shaft 29.

The ceramic base 21 is a disk-shaped member made of ceramic (aluminum nitride in this embodiment). The ceramic base 21 has a wafer placement surface 21*a* on which the wafer W can be placed. The ceramic shaft 29 is bonded to a central region of a surface (rear surface) 21*b* of the ceramic base 21 on the side opposite to the wafer placement surface 21*a*. As illustrated in FIG. 2, the RF electrode 22 and a heater electrode 27 are embedded in the ceramic base 21 in a state spaced from each other. The RF electrode 22 and the heater electrode 27 are parallel (including the substantially parallel case; this is similarly applied to the following description) to the wafer placement surface 21*a*, and they are embedded in the mentioned order from the side closer to the wafer placement surface 21*a*. The ceramic base 21 includes a hole 21*c* that is formed to extend from the rear surface 21*b* toward the RF electrode 22. A tablet 23 which is a conductive member connected to the RF electrode 22 is exposed at a bottom surface of the hole 21*c*.

The RF electrode 22 is a disk-shaped thin layer electrode having a slightly smaller diameter than the ceramic base 21 and is formed of a sheet-like mesh obtained by weaving a thin metal wire, which contains Mo as a main component, into a net. The tablet 23 having a disk-like shape is electrically connected to the RF electrode 22 near at a center. The tablet 23 is exposed at the bottom surface of the hole 21*c* that is formed in the rear surface 21*b* of the ceramic base 21. A material of the tablet 23 is the same as that of the RF electrode 22, i.e., Mo.

The heater electrode 27 is formed by wiring a coil, which contains Mo as a main component, in a one-stroke pattern over the entirety of the ceramic base 21. Heater terminal rods (not illustrated) are connected to both ends 27*a* and 27*b* (illustrated in FIG. 3) of the heater electrode 27 in a one-to-one relation. Those heater terminal rods are connected to an external power supply (not illustrated) after passing through a hollow inner space of the ceramic shaft 29.

The reason why Mo is used as materials of the RF electrode 22, the tablet 23, and the heater electrode 27 resides in that Mo has a thermal expansion coefficient close to that of the material (AlN in this embodiment) of the ceramic base 21 and cracking is harder to occur during manufacturing of the ceramic base 21. Other materials than Mo can also be used for the RF electrode 22, the tablet 23, and the heater electrode 27 insofar as those materials are electrically conductive and have thermal expansion coefficients close to that of AlN. A thermocouple (not illustrated) for detecting the temperature of the ceramic base 21 is inserted into a region of the rear surface 21*b* of the ceramic base 21, the region being surrounded by the ceramic shaft 29.

The ceramic shaft 29 is a cylindrical member made of the same ceramic as that of the ceramic base 21. An upper end surface of the ceramic shaft 29 is bonded to the rear surface 21*b* of the ceramic base 21 by diffusion bonding or TCB (Thermal compression bonding). TCB implies a known method of sandwiching a metal bonding material between two members that are bonding targets, and press-bonding those two members in a state heated to a temperature not higher than the solidus temperature of the metal bonding material.

An RF terminal 30 is formed by coating an Au thin film 34 over part of an outer peripheral surface of a Ni-made rod 32. More specifically, the Au thin film 34 is formed over a region (covered region) of the outer peripheral surface of the rod 32, the region ranging from a base end 32*a* of the rod 32 to a predetermined position 32*c* at which the rod is not inserted into the hole. Thus, the Au thin film 34 is not coated over a region (not-covered region) ranging from a tip end 32*b* of the rod 32 to the predetermined position 32*c*. A method of setting the predetermined position 32*c* will be described later. A tip end of the RF terminal 30 (i.e., the tip end 32*b* of the rod 32) is bonded to the tablet 23 of the RF electrode 22 with a brazed portion 24 interposed between them. A base end of the RF terminal 30 is connected to an RF power supply 40. The Curie point of Ni is about 354° C. Radio-frequency electric power of the RF power supply 40 is supplied to the RF electrode 22 through the RF terminal 30.

As illustrated in FIG. 1, the upper electrode 50 is fixed at an upper position (e.g., a ceiling surface of the not-illustrated chamber) opposing to the wafer placement surface 21*a* of the ceramic base 21. The upper electrode 50 is connected to a ground.

Figure 4:
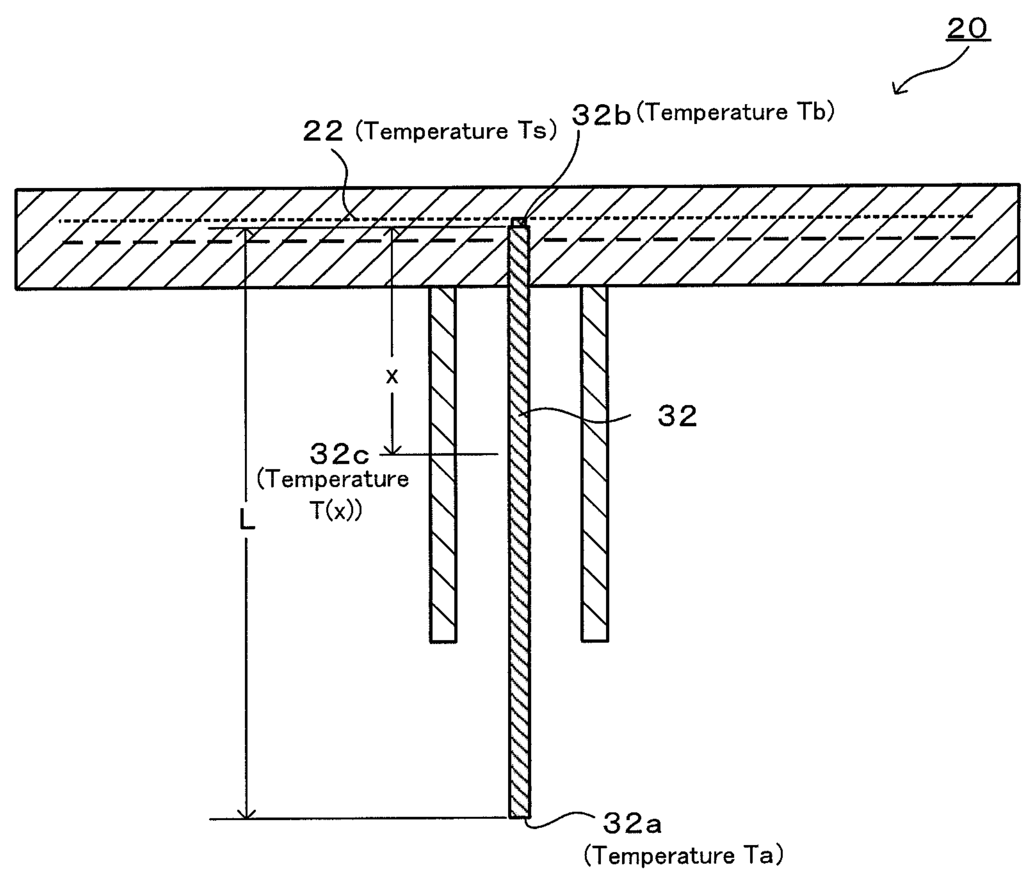
FIG. 4 is an explanatory view referenced to explain a method of setting a predetermined position 32*c*.

The predetermined position 32*c* is determined as follows. In the wafer support table 20, as illustrated in FIG. 4, a bare rod 32 not coated with the Au thin film 34 is attached instead of the rod 32 coated with the Au thin film 34. Then, assuming that a temperature of the heater electrode 27 is denoted by Ts [° C.] (Ts is higher than the Curie point of the material of the rod 32), a length of the rod 32 is denoted by L [cm], a difference between a temperature Tb at the tip end 32*b* of the rod 32 and a temperature Ta at the base end 32*a* thereof is denoted by ΔT (=Tb−Ta) [° C.], a length from the tip end 32*b* of the rod 32 (i.e., the end connected to the RF electrode 22) to the predetermined position 32*c* is denoted by x [cm], and a temperature at the predetermined position 32*c* of the rod 32 is denoted by T(x) [° C.], x [cm] is determined such that T(x) expressed by a formula (1) given below is not higher than the Curie point of the material of the rod 32. The temperature Tb at the tip end 32*b* of the rod 32 can be regarded substantially equal to a temperature Ts of the heater electrode 27.

$$T(x)=Ts-(\Delta T/L)*x \qquad (1)$$

A usage example of the plasma generator 10 will be described below. The plasma generator 10 is mounted inside the not-illustrated chamber, and the wafer W is placed on the wafer placement surface 21*a*. Then, radio-frequency electric power is supplied to the RF electrode 22 from the RF power supply 40. As a result, plasma is generated between parallel plate electrodes constituted by the upper electrode 50 and the RF electrode 22 embedded in the ceramic base 21. CVD film formation or etching is carried out on the wafer W by using the generated plasma. Furthermore, the temperature of the wafer W is determined on the basis of a detection signal from the not-illustrated thermocouple, and a voltage applied to the heater electrode 27 is controlled such that the temperature of the wafer W is kept equal to a setting temperature (e.g., 450° C., 500° C. or 550° C.)

In the wafer support table 20 described above in detail, the Ni-made rod is used to supply the radio-frequency electric power to the RF electrode 22. When the radio-frequency electric power is supplied to the Ni-made rod, the temperature of the rod is apt to become high in a range lower than the Curie point because impedance is large, but it is less apt to become high in a range not lower than the Curie point because impedance is small. The phenomenon of a temperature rise in a portion of the wafer W, the portion being positioned just above the rod 32, to a specifically high temperature as discussed in above "Technical Problem" is presumably attributable to the fact that, because the rod 32 is entirely heated to high temperature and heat dissipating from the ceramic base 21 through the rod 32 is smaller than that estimated. In the wafer support table 20, the Au thin film 34 is coated over a region of the outer peripheral surface of the rod 32, the region ranging from the base end 32*a* of the rod 32 to the predetermined position 32*c* (i.e., over a region relatively far away from the ceramic base 21). In this case, because Au has low impedance and a radio-frequency wave passes through the Au thin film 34 due to the skin effect, the temperature in a portion of the RF terminal 30, the portion being coated with the Au thin film 34, (i.e., the temperature in a portion relatively far away from the ceramic base 21) is less apt to become high, and that portion does not impede dissipation of heat from the ceramic base 21. On the other hand, because a portion of the rod 32, the portion being inserted into the hole 21*c*, is positioned near the heater electrode 27 and is heated to high temperature, the above portion does not substantially contribute to dissipating the heat from the ceramic base 21. Therefore, coating the above portion with the Au thin film 34 is disadvantageous in an economical point of view. Thus, the wafer support table 20 can prevent the temperature rise in a portion of the wafer W, the portion being positioned just above the rod 32 connected to the RF electrode 22, to the specifically high temperature at a low cost.

Moreover, as described above, the Au thin film 34 is coated over the region ranging from the base end 32*a* of the rod 32 to the predetermined position 32*c* and is not coated over the other region. It is, therefore, possible to prevent the temperature rise in a portion of the wafer W, the portion being positioned just above the rod 32 connected to the RF electrode 22, to the specifically high temperature while suppressing a usage of expensive Au. In particular, the length x [cm] from the tip end 32*b* of the rod 32 to the predetermined position 32*c* is set based on the above-mentioned formula (1). In the region between the predetermined position 32*c* set as described above and the base end 32*a* of the rod 32, the temperature is apt to become high because the impedance of the rod 32 is large. Thus, the significance of coating the Au thin film 34 over the above-mentioned region is high, but the significance of coating the Au thin film 34 over the other region is low.

It is needless to say that the present invention is not limited to the above-described embodiment, and that the present invention can be implemented in various embodiments insofar as not departing from the technical scope of the present invention.

Figure 5:
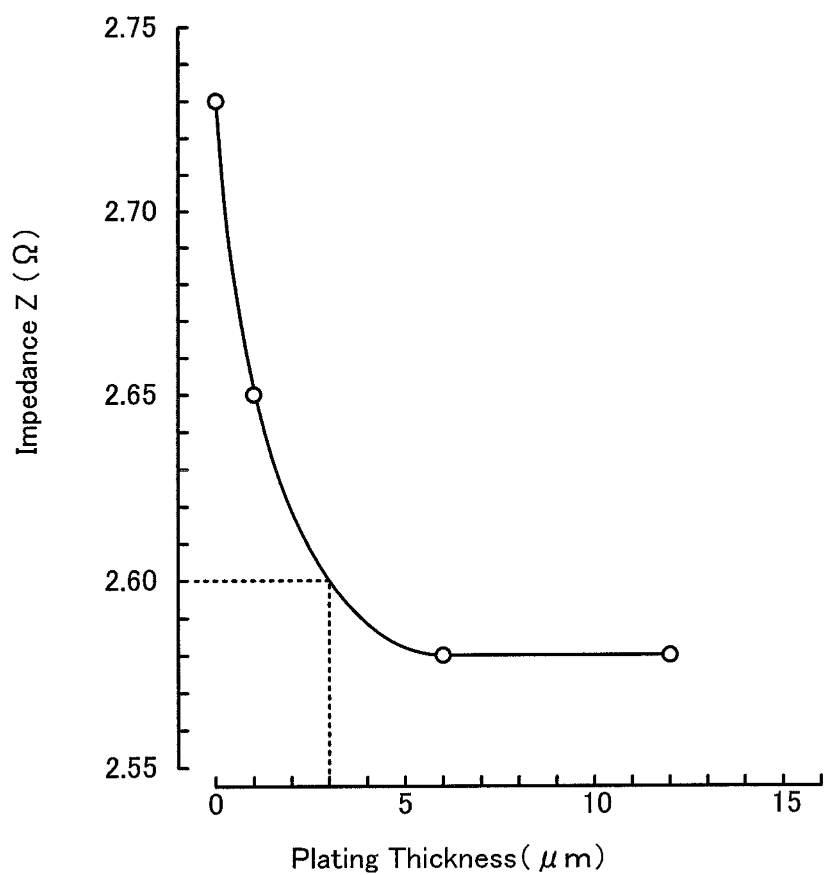
FIG. 5 is a graph depicting a relation between plating thickness and impedance.

For example, in the above-described embodiment, the Au thin film 34 preferably has a thickness of not less than 3 μm. If the thickness of the Au thin film 34 is not less than 3 μm, the impedance resulting when the radio-frequency electric power is supplied to the rod 32 can be held sufficiently small. On the other hand, even if the thickness of the Au thin film 34 is set to a value over 6 μm, the impedance resulting when the radio-frequency electric power is supplied to the rod 32 is substantially not changed. Taking into consideration economy, therefore, the thickness of the Au thin film 34 is preferably not more than 6 μm. The above point is described in more detail below. Impedance Z was measured by using, in the above-described embodiment, the RF terminal 30 in which the Au thin film 34 was formed by plating in thickness of 0 μm, 1 μm, 6 μm or 12 μm, and by supplying radio-frequency electric power (frequency of 13.56 MHz) to the RF terminal 30. The result of the measurement is plotted in FIG. 5. As seen from FIG. 5, the impedance in the case of the Au thin film 34 having the thickness of 3 μm is reduced 5% in comparison with the case of not including the Au thin film 34 (i.e., the case of the thickness being zero). Furthermore, as seen from FIG. 5, at the thickness of the Au thin film 34 until reaching 6 μm, the impedance Z reduces as the thickness increases. This is presumably attributable to the fact that surface resistance reduces as the thickness increases. On the other hand, even when the thickness of the Au thin film 34 exceeds 6 μM, the impedance is substantially not changed. This is presumably attributable to the fact that, if the Au thin film 34 is too thick, the surface of the Au thin film 34 has larger irregularities and the path of a current flowing along the surface is prolonged. For that reason, the thickness of the Au thin film 34 is preferably not less than 3 μm and not more than 6 μm. However, when there is no necessity of considering economy so much, an upper limit of the thickness of the Au thin film 34 may be set to 8 μm, 10 μm, or 12 μm.

Figure 6:
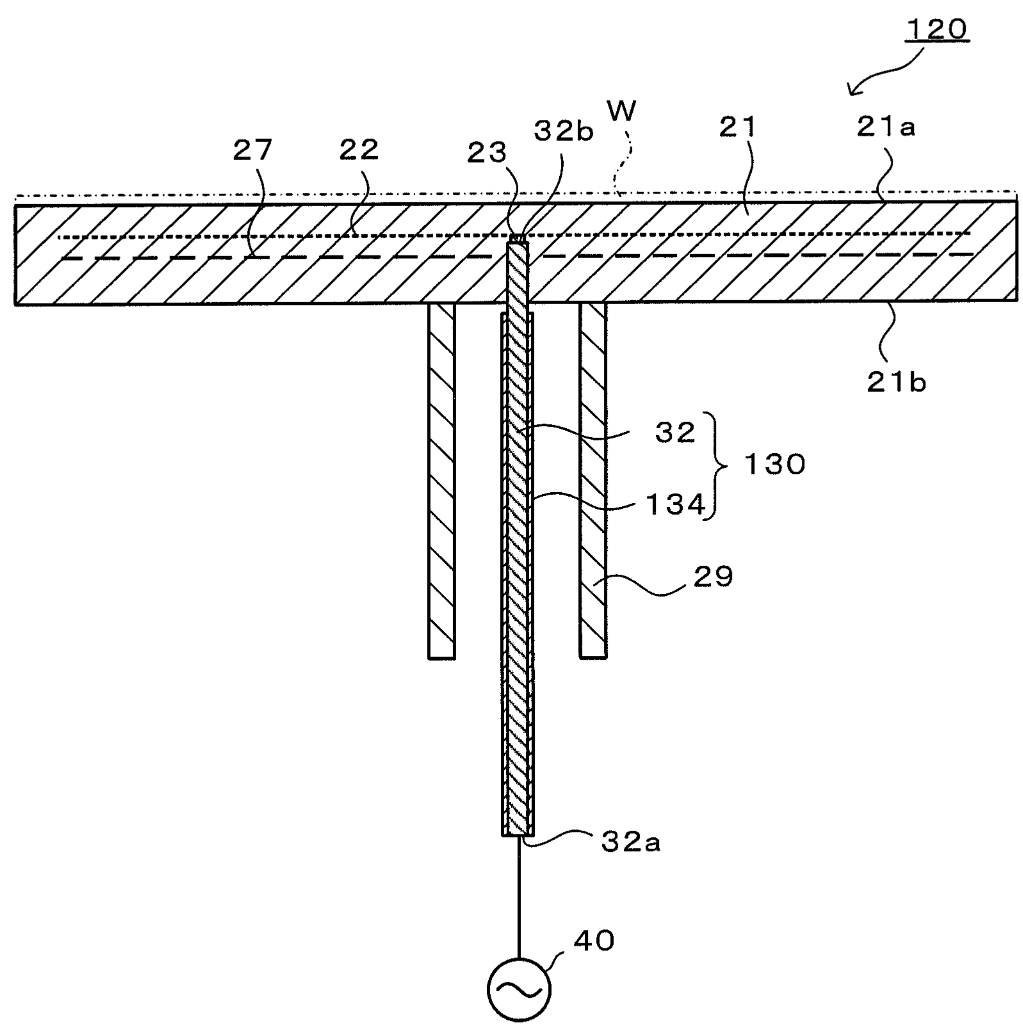
FIG. 6 is a sectional view of a wafer support table 120 including an RF terminal 130.

While, in the above-described embodiment, the Au thin film 34 is coated over the region ranging from the base end 32*a* of the rod 32 to the predetermined position 32*c*, an Au thin film may be formed as follows instead. As in an RF terminal 130 of a wafer support table 120 illustrated in FIG. 6, an Au thin film 134 may be formed not to cover a region of the rod 32, the region being positioned inside the ceramic base 21, and to cover the other region of the rod 32. In FIG. 6, the same components as those in the above-described embodiment are dented by the same reference numerals. Such a modification can also prevent the temperature rise in a portion of the wafer W, that portion being positioned just above the rod 32 connected to the RF electrode 22, to the specifically high temperature. However, the above-described embodiment is more preferable from the viewpoint of minimizing the usage of Au and realizing a lower cost.

Figure 7:
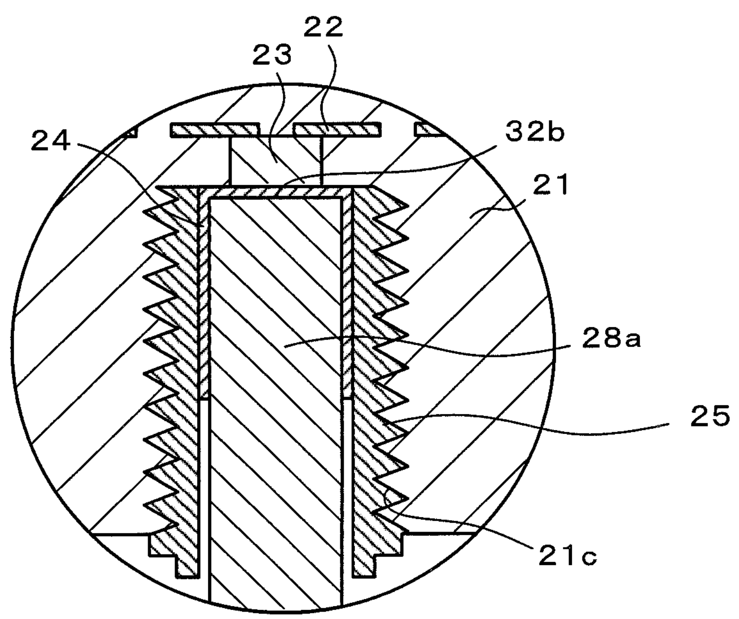
FIG. 7 is an enlarged sectional view of a rod bonded portion including a sleeve 25.

While, in the above-described embodiment, the tip end 32*b* of the rod 32 of the RF terminal 30 is bonded to the tablet 23 exposed at the bottom surface of the hole 21*c*, the present invention is not limited to such a particular example. In another example, the RF electrode 22 may be exposed at the bottom surface of the hole 21*c* without disposing the tablet 23, and the exposed RF electrode 22 and the tip end 32*b* of the rod 32 may be bonded to each other. Alternatively, the above-described embodiment may be modified as illustrated in FIG. 7. A thread groove is formed in an inner peripheral surface of a hole 21*c*, and a sleeve 25 made of the same material as that of the rod 32 and including a thread ridge formed on its outer peripheral surface is screwed into the hole 21*c* and brazed there. Then, the tip end 32*b* of the rod is inserted into the sleeve 25 and is brazed to the tablet 23 and an inner peripheral surface of the sleeve 25.

While the Ni-made rod is used in the above-described embodiment, a rod made of Kovar (alloy of Fe, Ni and Co) may be used instead. The Curie point of Kovar is about 435° C. Similar advantageous effects to those in the above-described embodiment can also be obtained in the case of using the Kovar-made rod.

While the RF electrode 22 is in the form of a mesh in the above-described embodiment, the RF electrode 22 may be formed in another suitable shape. For example, the RF electrode 22 may have a coiled or planar shape, or may be formed of a punching metal.

While AlN is used as the ceramic material in the above-described embodiment, the present invention is not limited to such a particular example, and another suitable material, for example, alumina, may be used instead. In that case, the RF electrode 22, the tablet 23, and the heater electrode 27 are each preferably made a material having the thermal expansion coefficient close to that of the ceramic used for the ceramic base.

In the above-described embodiment, the wafer W may be attracted to the wafer placement surface 21*a* by applying a voltage to the RF electrode 22. Alternatively, an electrostatic electrode may be further embedded in the ceramic base 21, and the wafer W may be attracted to the wafer placement surface 21*a* by applying a voltage to the electrostatic electrode.

While, in the above-described embodiment, the Au thin film 34 is coated over part of the outer peripheral surface of the Ni-made rod 32, a Cu thin film or an Ag thin film may be used instead of the Au thin film 34.

The present application claims priority from Japanese Patent Application No. 2018-086780 filed on Apr. 27, 2018, the entire contents of which are incorporated herein by reference.

What is claimed is:

1. A wafer support table comprising:

a ceramic base having a wafer placement surface and including an RF electrode and a heater electrode that are embedded in the ceramic base in mentioned order from side closer to the wafer placement surface;

a hole formed in the ceramic base to extend, toward the RF electrode, from a surface of the ceramic base on side opposite to the wafer placement surface;

a Ni- or an alloy of Fe, Ni, and Co-made rod bonded to the RF electrode exposed at a bottom surface of the hole or to a conductive member that is connected to the RF electrode and exposed at the bottom surface of the hole, and supplying radio-frequency electric power to the RF electrode therethrough; and a thin film of a copper family element coated over a region of an outer peripheral surface of the rod ranging from a base end of the rod to a predetermined position at which the rod is not inserted in the hole, wherein the thin film of the copper family element is formed not to cover a region of the outer peripheral surface of the rod positioned inside the ceramic base, and to cover less than the entire other region of the outer peripheral surface of the rod, which is not positioned inside the ceramic base.

2. The wafer support table according to claim 1, wherein the thin film of the copper family element has a thickness of not less than 3 μm and not more than 6 μm.

3. The wafer support table according to claim 1, wherein the predetermined position is determined by bonding a bare rod not coated with the thin film of the copper family element instead of the rod coated with the thin film of the copper family element, a temperature of the heater electrode is denoted by Ts, where Ts is higher than the Curie point of a material of the rod, a length of the rod is denoted by L [cm], a difference in temperature between both ends of the rod is denoted by ΔT [° C.], a length from a tip end of the rod to the predetermined position is denoted by x [cm], and a temperature at the predetermined position of the rod is denoted by T(x) [° C.], the predetermined position is determined such that T(x) expressed by a formula given below is not higher than the Curie point of the material of the rod;

$$T(x)=Ts-(\Delta T/L)*x$$

4. The wafer support table according to claim 2, wherein the predetermined position is determined by bonding a bare rod not coated with the thin film of the copper family element instead of the rod coated with the thin film of the copper family element, a temperature of the heater electrode is denoted by Ts [° C.], where Ts is higher than the Curie point of a material of the rod, a length of the rod is denoted by L [cm], a difference in temperature between both ends of the rod is denoted by ΔT [° C.], a length from a tip end of the rod to the predetermined position is denoted by x [cm], and a temperature at the predetermined position of the rod is denoted by T(x) [° C.], the predetermined position is determined such that T(x) expressed by a formula given below is not higher than the Curie point of the material of the rod;

$$T(x)=Ts-(\Delta T/L)*x$$

5. The wafer support table according to claim 1, wherein a thread groove is formed in an inner peripheral surface of the hole, a sleeve made of the same material as that of the rod and including a thread ridge formed on its outer peripheral surface is screwed into the hole and brazed, and a tip end of the rod is inserted into the sleeve and is brazed to an inner peripheral surface of the sleeve.

* * * * *